United States Patent
Marchenko et al.

(10) Patent No.: US 6,477,693 B1
(45) Date of Patent: Nov. 5, 2002

(54) METHOD FOR MANUFACTURING AND DESIGNING A WIRING OF A CHANNEL OF AN ELECTRONIC DEVICE AND ELECTRONIC APPARATUS

(75) Inventors: Alexander Marchenko, Moscow (RU); Andrey Plis, Moscow (RU); Gopal Vijayan, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/508,006

(22) PCT Filed: Feb. 17, 1998

(86) PCT No.: PCT/RU98/00042

§ 371 (c)(1),
(2), (4) Date: Mar. 6, 2000

(87) PCT Pub. No.: WO99/41685

PCT Pub. Date: Aug. 19, 1999

(51) Int. Cl.$^7$ ................................. G06F 17/50
(52) U.S. Cl. .................................... 716/14
(58) Field of Search ......................... 716/14

(56) References Cited

U.S. PATENT DOCUMENTS 5,793,643 A * 8/1998 Cai .............................. 716/12

FOREIGN PATENT DOCUMENTS

WO        WO97/34245       9/1997       ........... G06F/17/50

OTHER PUBLICATIONS

S–C Fang et al., A New Efficient Approach to Multilayer Channel Routing Problem, 29$^{th}$ ACM/IEEE Design Automation Conference, pp. 579–584, Jul. 1992.*

Koji Sato et al., A Grid–Free Channel Router, 17$^{th}$ ACM/IEEE Design Automation Conference, pp. 22–31, Jun. 1980.*

T. Yoshimura, An Efficient Channel Router, 21$^{st}$ Design Automation Conference, pp. 38–44, Jun. 1984.*

M. Wada, A Dogleg "Optimal" Channel Router with Completion Enhancements, 18$^{th}$ Design Automation Conference, pp. 762–768, Jun. 1981.*

Jovanovic A D: "Modeling the Vertical Constraints in VLSI Channel Routing", Proceedings Great Lakes Symposium on VlSI Design Automation of High Performance VLSI Systems, Mar. 5, 1993, pp. 11–13, XP002042126.

Bryan Preas: "Channel Routing with Non–Terminal Doglegs", Proceedings of the European Design Automation Conference, Mar. 1990, Glasgow, UK, pp. 451–458.

David N. Deutsch: "A Dogleg Channel Router", Proceedings of 13$^{th}$ ACM/IEEE Design Automation Conference, 1976, pp. 425–433.

Naveed Sherwani: "Algorithms for VLSI Physical Design Automation", Second Edition, 1995, Kluwer Academic Publishers, pp. 267–344.

* cited by examiner

*Primary Examiner*—Vuthe Siek
*Assistant Examiner*—A. M. Thompson

(57) ABSTRACT

The invention relates to a method for manufacturing of electronic devices, such as very large scale integrated devices, having a channel. The channel routing is done based on a compositional approach in which initially all individual terminals are represented by individual nodes in a terminal vertical constraint graph. Individual constraints between individual terminals are represented by separate edges. This approach allows the resolution of difficult classes of routing problems in an efficient way.

5 Claims, 9 Drawing Sheets

SORTED EDGES:
  c=2; (FIXED)
  d=2; (FIXED)
  a=0;
  b=0;
TOTAL RATING=4

US 6,477,693 B1

METHOD FOR MANUFACTURING AND DESIGNING A WIRING OF A CHANNEL OF AN ELECTRONIC DEVICE AND ELECTRONIC APPARATUS

FIELD OF THE INVENTION

This invention relates generally to the field of the design and manufacture of electronic devices, such as printed circuit boards and semiconductor devices, and more particularly to improvements in designing the wiring of a channel.

BACKGROUND OF THE INVENTION

For the design of the wiring of a channel numerous approaches are known from the prior art. In the reference book by Naveed Sherwani, "Algorithms for VLSI Physical Design Automation", Second Edition, 1995, Kluwer Academic Publishers, an overview of prior art routing approaches is given, especially on pages 267 to 339.

One approach which is commonly used in the prior art for channel routing is the modeling of the routing problem by means of a vertical constraint graph. In a vertical constraint graph each net to be routed is represented by one node in the graph. If a vertical constraint exists between any terminal of a net and any terminal of another net the two corresponding nodes in the vertical constraints graph are connected by a directed edge in order to represent the vertical constraint. This way initially each net to be routed is assumed to be routable by just one horizontal trunk in the channel.

If any cycles exist in the vertical constraints graph these must be removed by a technique called "doglegging" prior to the actual assignment of trunks. The doglegging technique is also described in the above cited reference by Naveed Sherwani, in Chapter 7.4.2.2, pages 299–301. A more detailed description of the doglegging technique is given in D. N. Deutsch,"A dogleg channel router", Proceedings of 13th ACM/IEEE Design Automation Conference, page 425–433, 1976 and in Preas, "Channel Routing with Non—Terminal Doglegs", Proceedings of the European Design Automation Conference, March 1990, Glasgow, UK, pages 451–458.

With reference to FIG. 1. a common prior art approach of using a vertical constraint graph and doglegging for channel routing is explained in more detail:

In step 100 all the terminals of the same net to be routed are logically unified into one single imaginary trunk in the channel. In step 102 a vertical constraints graph is built according to this abstraction.

In step 104 it is decided whether the vertical constraints graph built in step 102 has cycles. If no cycles exist this means that the channel can in fact be routed by making usage of the imaginary trunks as defined in step 100. In this case the trunks are in fact assigned to the channel in step 106 in order to produce the wiring layout.

If there are cycles in the vertical constraint graph the control goes from step 104 to step 108. In step 108 cycles in the vertical constraints graph are removed by means of doglegging. By doglegging the imaginary trunks as defined in step 100 are broken up into segments in order to remove conflicting vertical constraints. Next in step 106 the assignment of trunks to the channel is done.

The main disadvantages of this prior art approach are the computational requirements which increase by the power of four with the number of nets and the fact that it is not guaranteed that—even after lengthy computation—all cycles can be removed in step 108 before the trunks are assigned to the channel for all classes of channel routing problems encountered in practice. Therefore a need exists for an enhanced method for designing and manufacturing an electronic device.

SUMMARY OF THE INVENTION

The underlying problem of the invention is solved basically by applying the features laid down in the independent claims. Preferred embodiments are given in the dependent claims.

The method of the invention is advantageous in that it allows the design and manufacture of an electronic apparatus, such as an integrated circuit chip or printed circuit board which has conflicting vertical constraints for which no solution could be found by any prior art design method.

The classes of problems which can be solved by the method of the invention include the following classes for which known prior art design methods fail:

1. Conflicting vertical constraints which can not be resolved by splitting of a node in the vertical constraints graph because splitting does not result in reducing the number of cycles; and
2. Conflicting vertical constraints which can not be resolved because splitting of the respective node does not create a cycle.

The invention is advantageous in that it uses a compositional approach. Initially all the terminals of the channel to be routed are represented individually in the terminal vertical constraints graph and also the vertical constraints which exist between individual terminals are represented in the terminal vertical constraint graph. This way the complete information about the routing problem to be solved is included in the terminal vertical constraint graph.

Further the compositional approach of the invention is advantageous in that it requires far less computing time; the computational requirements only increase with the power of three with the number of nets. Further, unnecessary computing time is saved because according to the invention the existence of a solution can be predicted at an early stage.

Further, the method of the invention can be applied under weaker restrictions as compared to the prior art so that the channel routing quality can be improved thereby.

This leads to the design and production of enhanced electronic devices which feature a more compact channel wiring design and therefore require less silicon floor space and less power dissipation. The more compact channel wiring design which results from the method of the invention also positively impacts signal propagation delays and therefore the overall operational speed of the electronic device and/or the electronic apparatus, such as a digital radio or audio device, in which it is integrated.

Further, the invention is advantageous in that it can be readily implemented by means of a computer program which is stored on an computer readable storage medium.

DETAILED DESCRIPTION OF A PREFERRED EMBODIMENT

Figure 1:
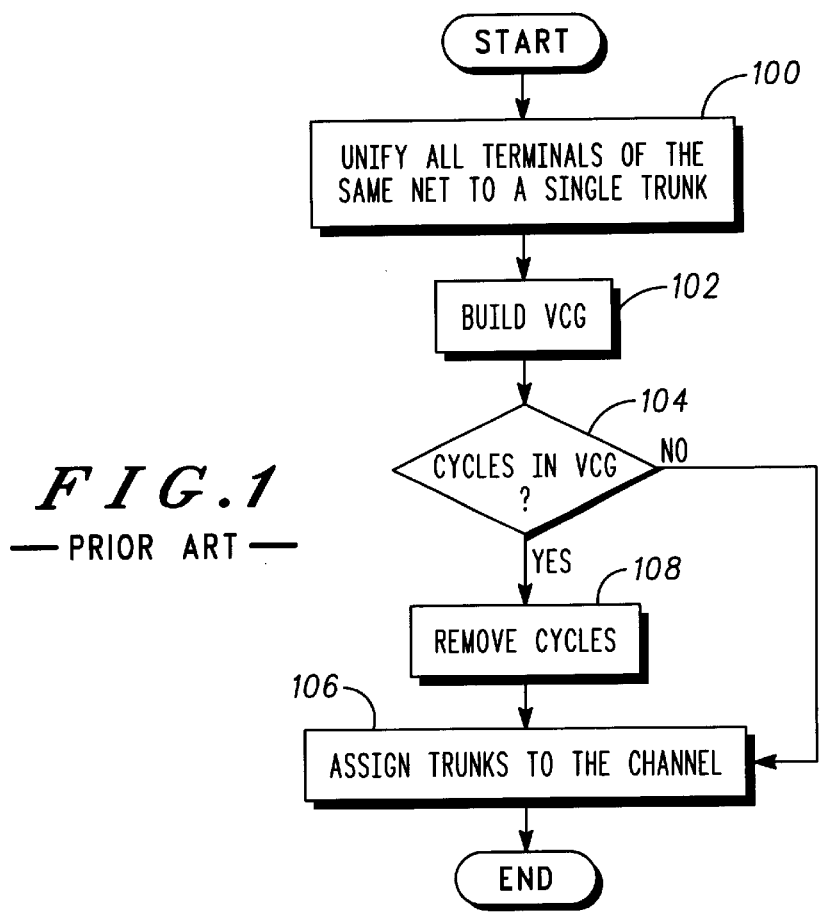
FIG. 1 shows a flow chart of a prior art method for designing the wiring of a channel.
Figure 2:
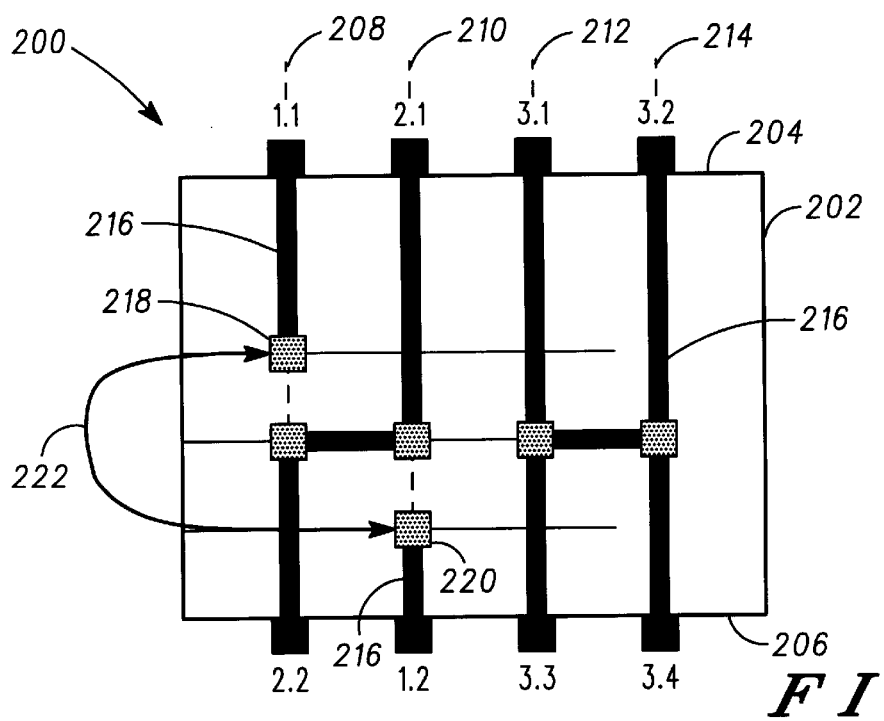
FIG. 2 is a diagrammatic view of a channel routing problem which can be solved by an embodiment of the invention.

FIG. 2. shows an electronic device 200 which has a channel 202. The electronic device 200 can be any kind of electronic apparatus, such as a digital telephone or audio device. The channel has an upper boundary 204 and a lower boundary 206; along the upper boundary 204 the terminals 1.1, 2.1, 3.1 and 3.2 are situated from the left to the right in the columns 208, 210, 212 and 214, respectively.

On the lower boundary 206 the terminals 2.2, 1.2, 3.3 and 3.4 are situated in the columns 208, 210, 212 and 214, respectively. The terminals 1.1 and 1.2 belong to the same net 1 to be routed. Likewise the terminals 2.1 and 2.2 belong to net 2 and the terminals 3.1, 3.2, 3.3 and 3.4 belong to net 3.

The terminals 1.1 to 3.4 constitute a set of terminals and the terminals belonging to the same net constitute sub-sets of this set of terminals. Further the channel 202 has wiring 216 comprising vias 218 and 220. The vias 218 and 220 can not be routed according to any known prior art routing algorithm because doglegging is not possible in view of the fact that there is no empty column available. The corresponding unresolved conflicting vertical constraint is indicated by double-headed arrow 222. The teaching of the invention allows to resolve such a class of routing problems as will be described in more detail in the following.

Figure 3:
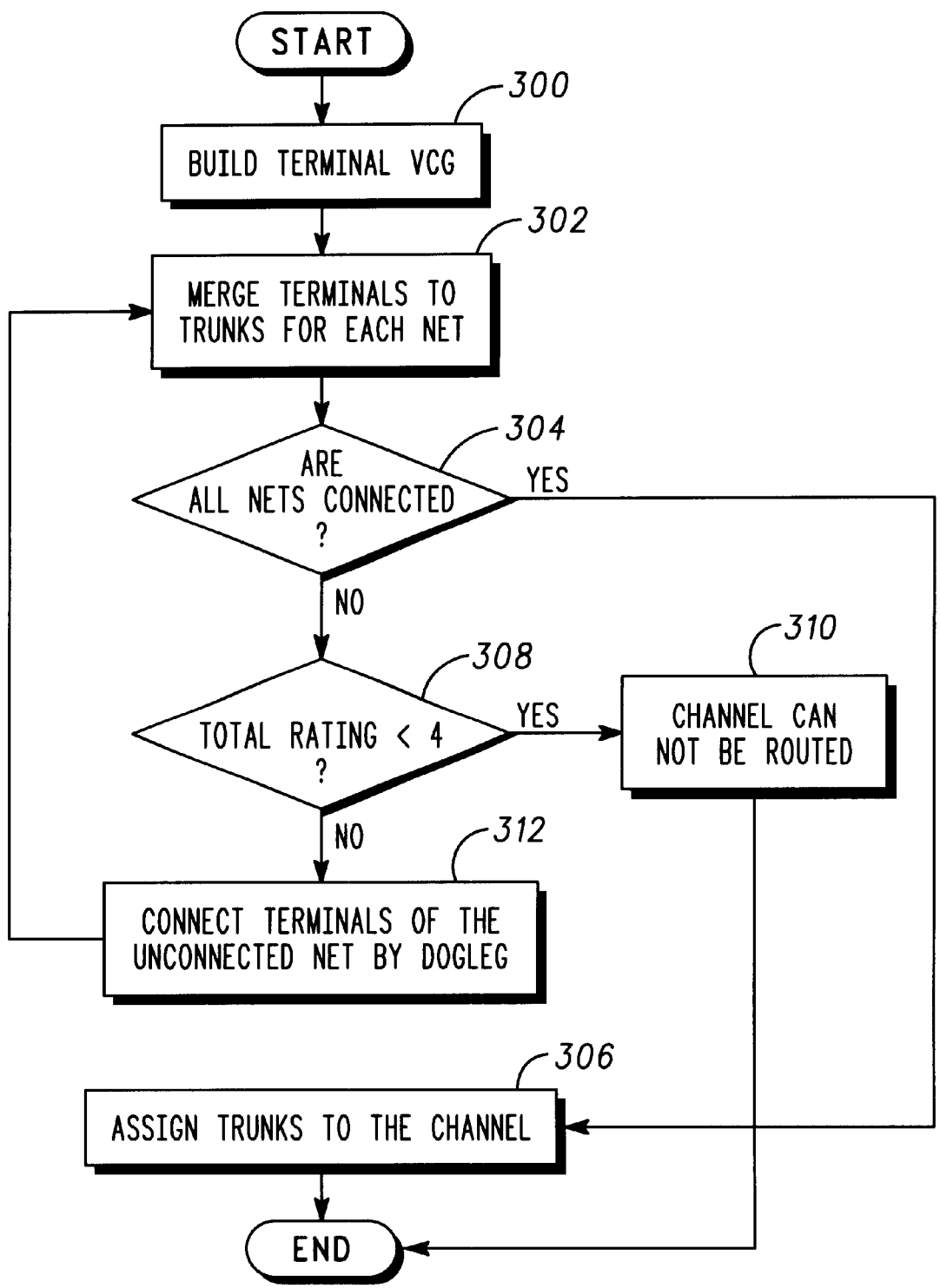
FIG. 3 shows the overall flow chart of the preferred embodiment of the invention.

The flow chart of FIG. 3 shows the overall process flow of the design method of the invention. In step 300 the terminal vertical constraints graph of the channel to be routed is build. In the terminal vertical constraint graph each terminal of each net to be routed is initially represented by a separate node and constraints between individual terminals are represented by individual directed edges within the terminal vertical constraints graph.

In step 302 such nodes of the terminal vertical constraints graph are merged which can be representative of one vertical routing segment in the channel without creating unallowed conflicts. The corresponding node in the resulting terminal vertical constraints graph which results from the merging of two other nodes is representative of the terminals which initially have been represented by the individual nodes; further, a resulting merged node is also representative of a common imaginary trunk of the terminals being represented by the new node In step 304 it is decided whether all of the nets are connected in the terminal vertical constraint graph by merging and/or doglegging operations. If this is the case the trunks can actually be assigned to the channel in step 306 so that the design of the wiring is complete.

If there are unconnected nets the control goes to step 308. In step 308 a total rating of the edges of the terminal vertical constraint graph is compared to a predefined threshold. In the example considered here the threshold is 4. If the total rating is below the threshold, this indicates that the channel can not be routed (step 310); if this is the case the design process can stop so that further computing efforts are saved.

If the total rating is equal or above the threshold the control goes to step 312 to connect the terminals of unconnected nets by doglegging. After the doglegging the control returns back to step 302.

Figure 4:
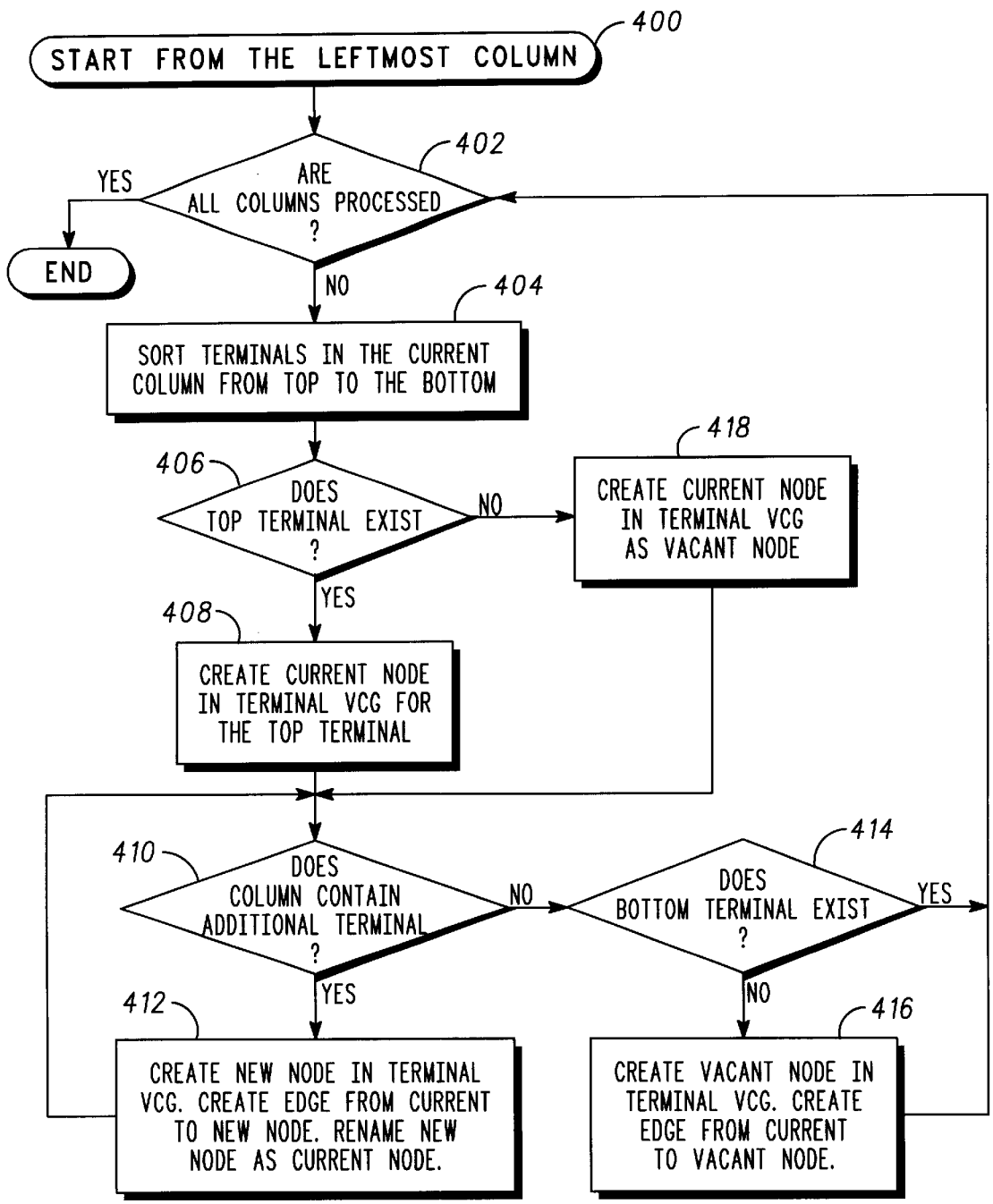
FIG. 4 shows a flow chart illustrating the creation of the terminal vertical constraints graph.

FIG. 4. shows in more detail a generation of a terminal vertical constraint graph. In the preferred embodiment considered here the process starts from the left most column of the channel to be routed (step 400). In step 402 it is decided whether all columns have been processed. If this is the case the terminal vertical constraint graph is complete. If this is not the case the control goes to step 404.

In step 404 the left most column is considered to be the current column. The terminals which are situated in the current column are sorted into terminals being situated on the upper and lower boundary of the channel.

In step 406 it is decided whether a terminal exists on the upper boundary in the current column. If this is the case in step 408 a new node is created in the terminal vertical constraint graph to represent the terminal identified in step 406 which is situated on the upper boundary of the channel in the current column.

In step 410 it is decided whether the current column does contain an additional terminal. If this is the case in step 412 a new node in the terminal vertical constraint graph is created as well as an edge from the current to the new node. Subsequently, the new node is defined to be the current node. This is done in step 412.

After step 412 has been carried out the control returns back to step 410. If it is decided in step 410 that the current column does not contain an additional terminal which was not processed before the control goes to step 414.

In step 414 it is decided whether in the current column a terminal exists on the lower boundary. If this is not the case the control goes to step 416. In step 416 a vacant node is created in the terminal vertical constraint graph which is representative of the vacant position on the boundary of the channel as identified in step 414. Further in step 416 an edge is created from the current to the vacant note. After step 416 has been carried out the control goes to step 402.

If it is decided in step 414 that a terminal exists on the lower boundary of the channel the control goes directly to step 402.

If it is decided in step 406 that a terminal on the upper boundary of the channel does not exist the control goes to step 418. In step 418 a new node is created in a terminal vertical constraint graph as a vacant note which is representative of the vacant position on the upper boundary of the channel. A new node is defined to be the current node. After step 418 has been carried out the control goes to step 410.

As a result of the process illustrated in FIG. 4 each individual terminal of all the nets to be routed is represented in the terminal vertical constraint graph by a separate node. In addition, vacant positions along a boundary of the channel on which no terminal is placed but is allowed to be placed are represented by vacant nodes in the terminal vertical constraint graph.

Vertical constraints which exist between terminals and also between vacant terminals are represented by directed edges between the nodes. From the way the terminal vertical constraint graph according to this preferred embodiment of the invention is generated it follows that the terminal vertical constraint graph can not have cycles. The reason is that each edge is only representative of a vertical constraint which exists between a pair of terminals which are situated in the same column.

Figure 5:
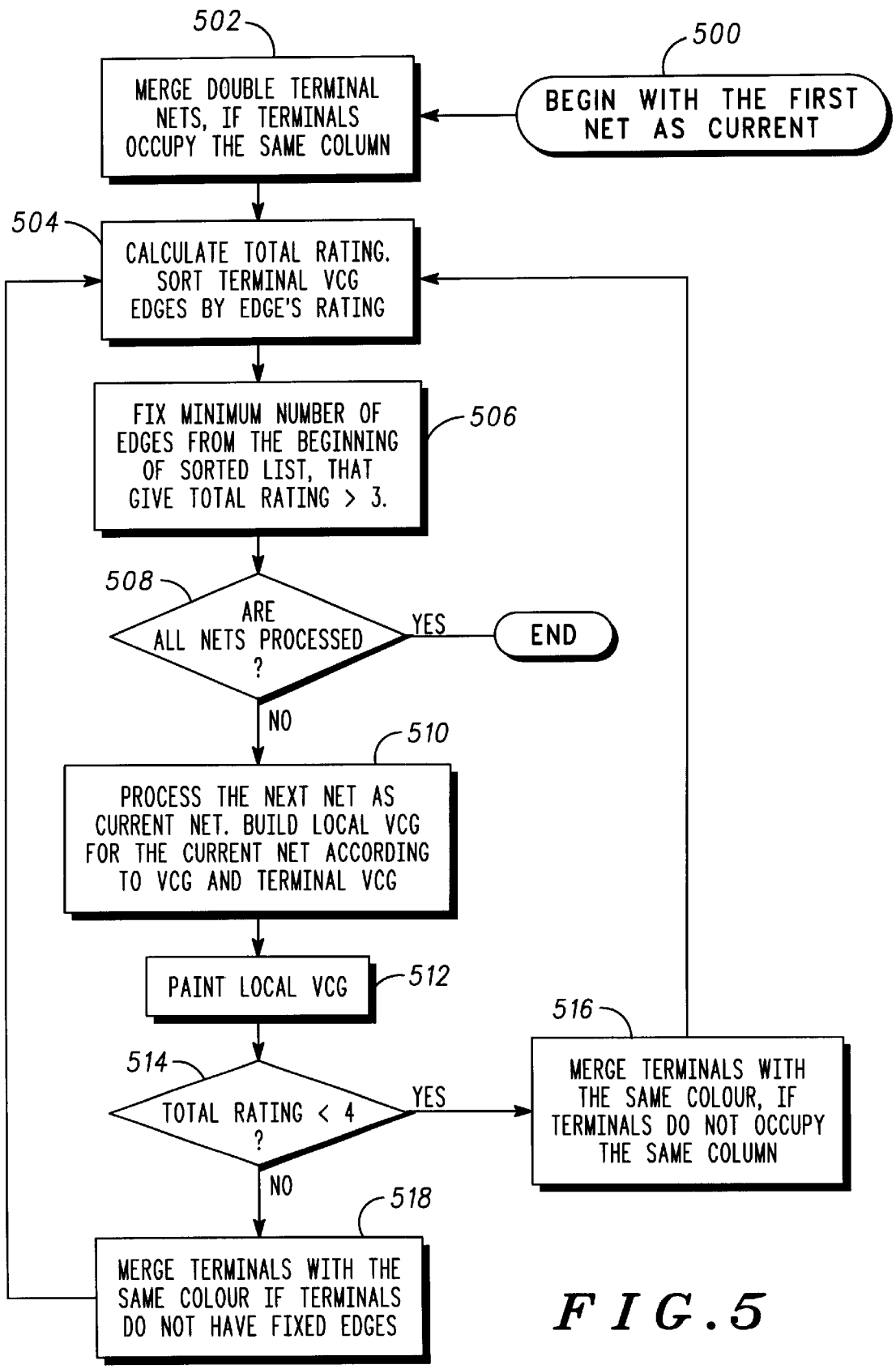
FIG. 5 shows a flow chart illustrating the process of merging of terminals in the terminal vertical constraints graph.

With reference to FIG. 5 now the step 302 of FIG. 3. is explained in more detail. In step 500 an arbitrary one of the nets to be routed is selected as the current net. Before the main procedure starts any nets having just two terminals are identified. If the two terminals are situated in the same column of the channel, the corresponding nodes which represent such terminals are merged in step 502.

In step 504 the main procedure starts: Without loss of generality in the following it is assumed that the terminal vertical constraint graph which is created in step 300 has a number of i edges E1, E2, E3, . . . Ei.

First in step 504 a rating is calculated for each one of the edges. The individual ratings Rj(Ej) of the edges Ej are summed which yields the total rating. Next the edges are sorted according to their rating in descending order which yields a list L1, where L1={E1, E2, E3, . . . Ei} and E1 having the highest rating R1.

Next in step 506 the minimum number of edges is identified starting from the beginning of the sorted list L1 in order to generate a list L2. The list L2 contains only such edges from the beginning of L1 which yield a total rating which is above a predefined threshold—in this case 3. In order to generate the list L2 a minimum value of k has to be found so that the following condition is fulfilled:

$$\sum_{j=1}^{k} Rating(Ej) > Threshold = 3$$

This yields the list L2.

L2={E1, E2, E3, . . . Ek}

In step 508 it is decided whether all nets have already been processed. If this is the case the process flow of FIG. 5 ends and returns back to the process flow shown in FIG. 3 where the step 304 is the next step to be carried out.

If there are unprocessed nets step 510 as shown in FIG. 5 is carried out next. In step 510 an arbitrary net which has not been processed yet is selected as the current net. For the current net a local vertical constraint graph is generated—in view of the vertical constraint graph and the terminal constraint graph of the channel to be routed. The generation of the local terminal graph is done as follows:

First a vertical constraint graph is generated as it is as such well-known from the prior art. In the vertical constraint graph the node which is representative of the current net is selected. The selected node in the vertical constraint graph is substituted by the nodes of the terminal vertical constraint graph which are representative of terminals belonging to the current net. The affected edges of the vertical constraint graph are connected to the corresponding substituent nodes of the terminal vertical constraint graph.

The local terminal graph to be generated for the current net comprises the substituent nodes. Further, whether any given pair of nodes of the local terminal graph is to be connected by an undirected edge is determined by the following condition: If there is a path from one of the substituent nodes in the vertical constraint graph to the other substituent note of the considered pair, there must be an edge between the nodes of the considered pair in the local terminal graph.

In step 512 the local terminal graph is painted with the minimum number of colors so that only nodes of the local terminal graph which are not connected by an edge have the same color. Methods for coloring a graph in order to find the so-called chromatic number are known from the prior art, for example Claude Berge, "Theorie Des Graphes Et Ses Application", Dunod, Paris, 1958 as well as from "J. A. Bondy, U.S.R. Murty, "Graph Theory with Applications", Elsevier North Holland, New York, 1980, Chapter 8 (Vertex Colorings), page 133 and N. Christofides, "An Algorithm for the chromatic number of a graph", The Computer Journal, Vol. 14, page 38–39".

In step 514 it is decided whether the total rating as given by the summation of all the edge ratings is below a threshold—in the example considered here 4.

If the total rating is below 4 the control goes to control 516. In step 516 nodes in the local terminal graph are identified which have the same color. These nodes are substituent nodes from the original terminal vertical constraint graph. If the terminals which are represented by nodes having the same color in the local terminal graph are situated in the same column the corresponding nodes which are representative of these terminals in the terminal vertical constraint graph are merged. Next the control goes back to step 504 in order to carry out the main process again with the transformed terminal vertical constraint graph.

If the total rating is not smaller than 4 the control goes from step 514 to step 518. In step 518 again the nodes of the local vertical constraint graph having the same color are grouped. Such nodes of the local vertical constraint graph which have the same color—and are thus in the same group—and which are representative of terminals which are not connected to an edge of the List L2 are merged in the terminal vertical constraint graph. Next the control returns to step 504.

Figure 6:
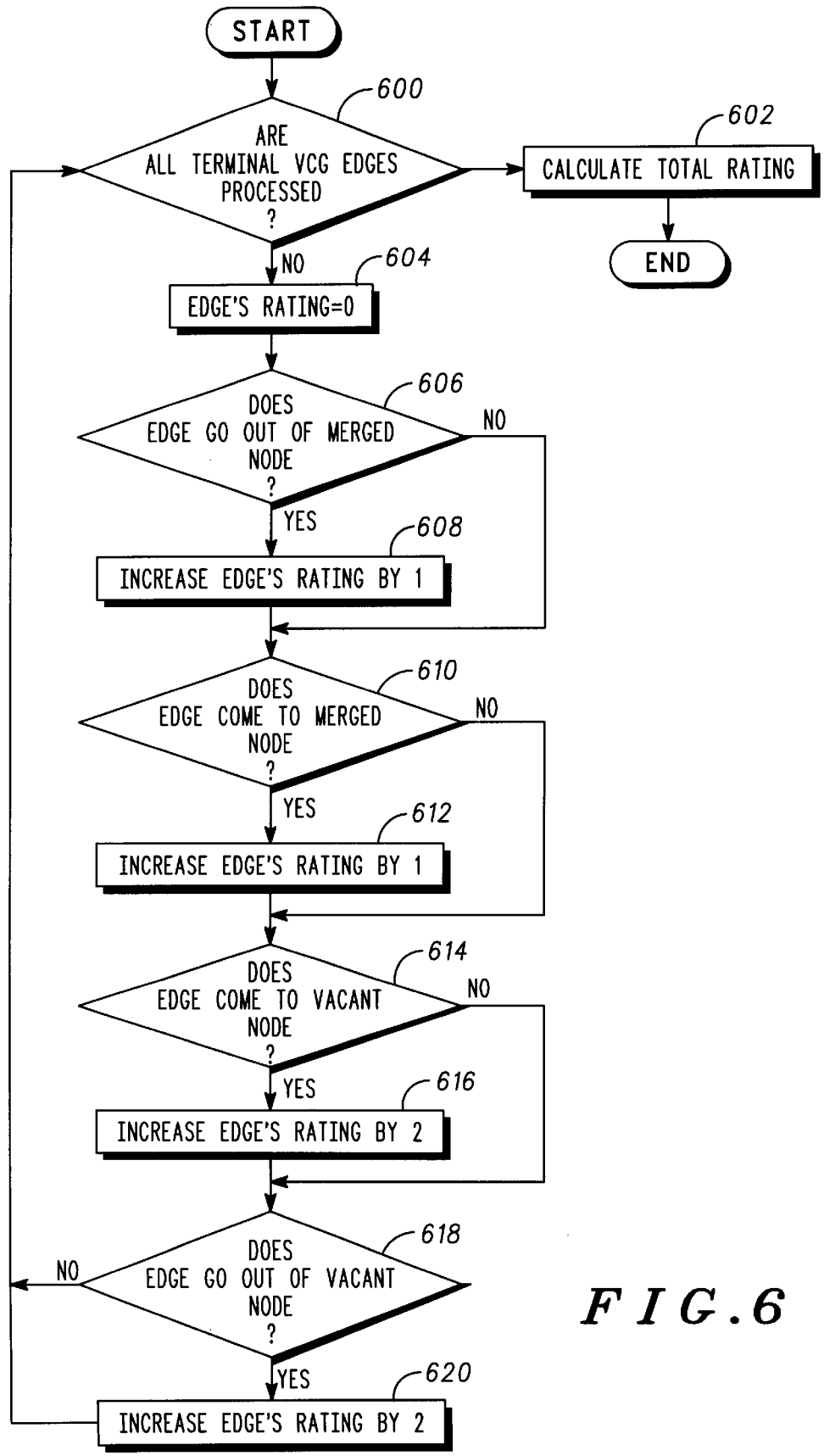
FIG. 6 is a flow chart illustrating the determination of the rating of an edge in the terminal vertical constraint graph.

With reference to FIG. 6 now a preferred embodiment of the calculation of the ratings of the edges of the terminal vertical constraint graph is explained in more detail. In step 600 it is decided whether all edges of the terminal vertical constraint graph have already been processed; if this is the case the total rating of the terminal vertical constraint graph is calculated in step 602 by summing up all the edge ratings of all edges contained in the terminal vertical constraint graph.

If all the edges of the terminal vertical constraint graph have not been processed yet, an arbitrary edge is selected from the unprocessed edges in step 600. The selected edge is the current edge and the control goes to step 604 in which the rating of the current edge is initially set to a predefined value—which in the example considered here is 0.

In step 606 it is decided whether the current edge originates from a node in the terminal vertical constraint graph which is the result of a merge operation (cf. step 302 in FIG. 3). If this condition is fulfilled the rating of the current edge is increased by a predefined value—in this case 1. This is done in step 608. If the condition of step 606 is not fulfilled step 608 is bypassed.

Next it is decided in step 610 whether the current edge is directed towards a node in the terminal vertical constraint graph which is resulting from a prior merge operation. If this is the case the rating of the current edge is increased by a predefined value—in this case 1—in step 612. If this is not the case step 612 is bypassed.

Next in step 614 it is decided whether an edge is directed towards a vacant node in the terminal vertical constraint graph. If this is the case in step 614 the rating of the current edge is increased by a predetermined value—in this case 2. If this in not the case, the step 616 is bypassed.

Next in step 618 it is decided whether the current edge is originating from a vacant node. If this is the case the rating of the current net is increased by a predefine value—in this case 2. This is done in step 620. Otherwise step 620 is bypassed. Next the control goes back to the step 600. This process is repeated until all edges of the terminal vertical constraint graph have been processed.

Next the step 312 of FIG. 3 is explained in more detail with reference to the flow chart of FIG. 7. In step 700 an arbitrary edge of the terminal vertical constraint graph is selected as the current edge. In step 702 it is decided whether all edges of the terminal vertical constraint graph have already been processed. If this is not the case the control goes to step 704 in which it is decided whether the rating of the current edge equals a predefined value—in this case 4. If this is the case the control goes to step 706 in which it is decided whether doglegging is possible for the current edge. If this is the case the control goes to step 708 in which a dogleg is made by making usage of the current edge. After doglegging has been done the flow shown in FIG. 7 stops at step 710 and the control returns back to FIG. 3 in which step 302 is the next one to be carried out.

Figure 7:
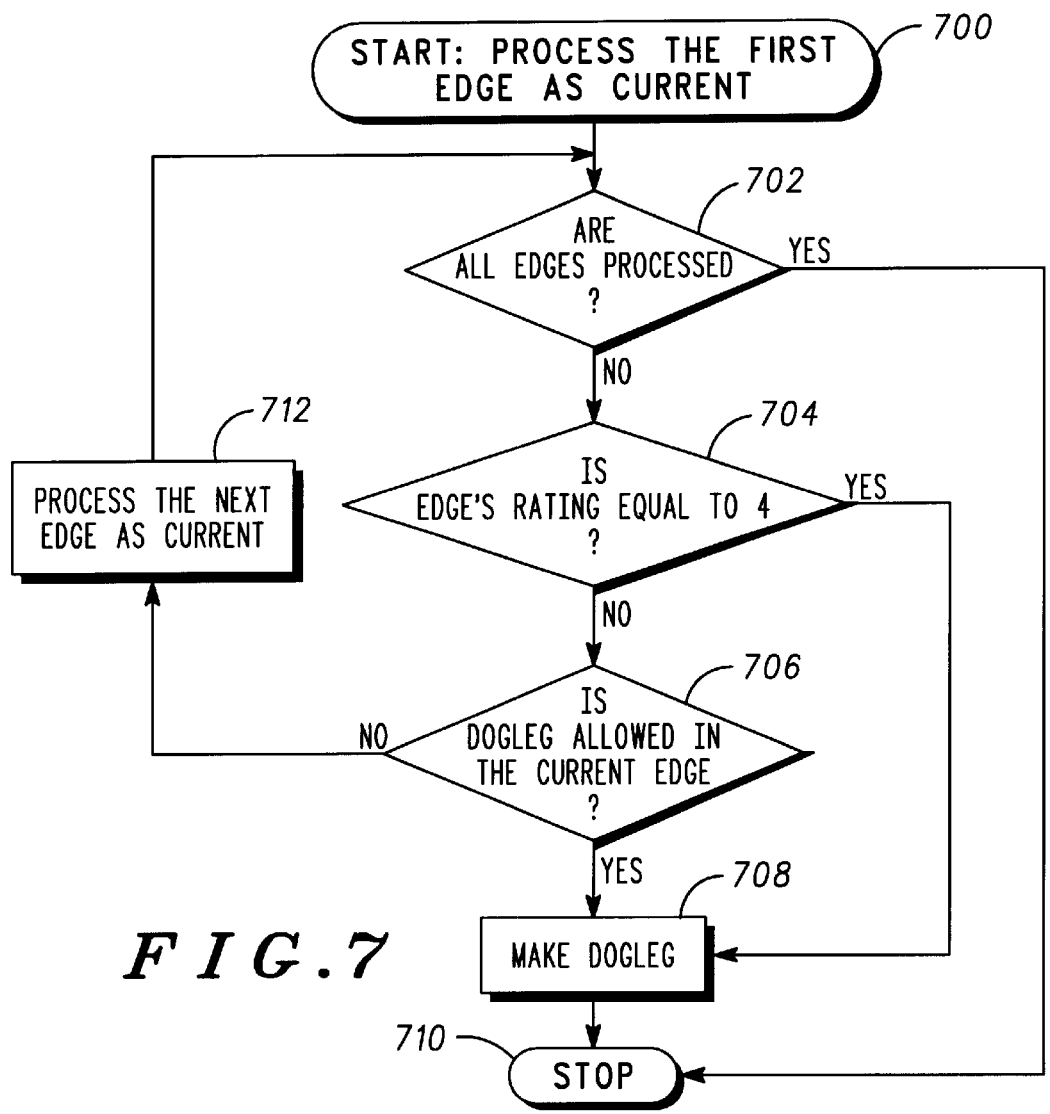
FIG. 7 is a flow chart illustrating the connection of terminals by doglegging.

If it is decided in step 706 of FIG. 7 that a dogleg is not allowed for the current edge the control goes to step 712 in which another arbitrary edge is selected as the current edge. From step 712 the control goes to step 702.

If it is decided in step 704 that the rating of the current edge is equal to the predefined value of 4 the control goes directly to step 708.

If it is decided in step 702 that all edges have already been processed the control goes directly to step 710.

Figure 8:
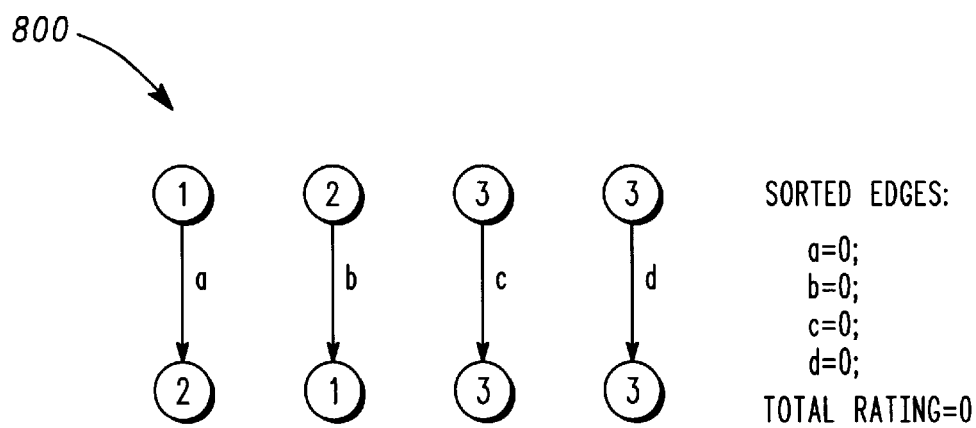
FIG. 8 shows a terminal vertical constraint graph for the routing problem depicted in FIG. 2.

In the following an example is described applying the preferred embodiment of the method of the invention to the channel routing problem as depicted in FIG. 2. With reference to FIG. 8 now the terminal vertical constraint graph 800 which results from carrying out the step 300 of FIG. 3 is shown.

The terminal vertical constraint graph 800 has a separate node for each separate terminal. The individual notes of the terminal vertical constraint graph 800 are interconnected by edges a, b, c and d which are representative of the corresponding vertical constraints as apparent from the channel 202 shown in FIG. 2. When step 302 is carried out for the first time the ratings of the edges are calculated. Since in the example considered here there are neither vacant nodes nor merged nodes the initial rating of all the edges is 0. As a consequences also the total rating is 0.

Figure 9:
FIG. 9 illustrates the construction of a local vertical constraint graph for the net 3 of FIG. 2.
Figure 9:
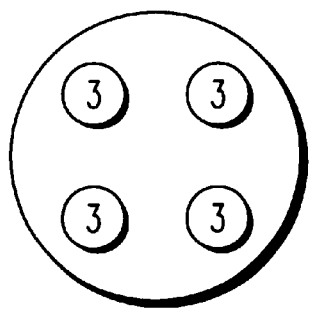

FIG. 9 illustrates the situation of step 510 after the net 3 has been selected as the current net. In the vertical constraint graph of the channel routing problem of FIG. 2 the node 3 is substituted by the nodes of the terminal vertical constraint graph which are representative of the terminals belonging to the node 3. As there are no vertical constraints in the vertical constraint graph for the node 3 its substituent nodes are isolated so that no path exists between any pair of substituent nodes as it is also apparent from FIG. 9.

Figure 10:
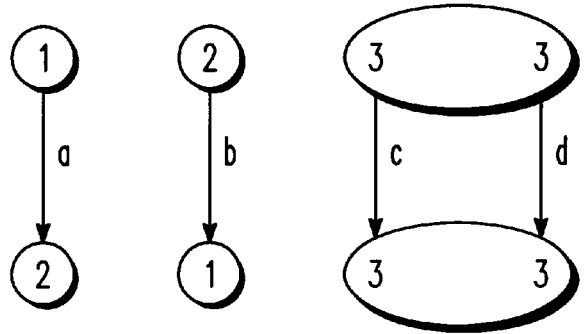
FIG. 10 shows the terminal vertical constraints graph of FIG. 8 after a merge operation.

As a consequence all the substituent nodes can be painted with the same color and grouped into the same group since the total rating is equal to 0; the control goes from step 514 to 516 in which nodes of the current net which have the same color and do not occupy the same column are merged. This has the result that 2 pairs of nodes being representative of terminals belonging to the net 3 are merged as it is shown in FIG. 10.

Next the control goes to step 504 in which the rating is again calculated. After the first transformation of the terminal vertical constraint graph from FIG. 8 to FIG. 10 ratings of the edges c and d change from 0 to 2. As a consequence the list L2 contains the two edges c and d.

Figure 11:
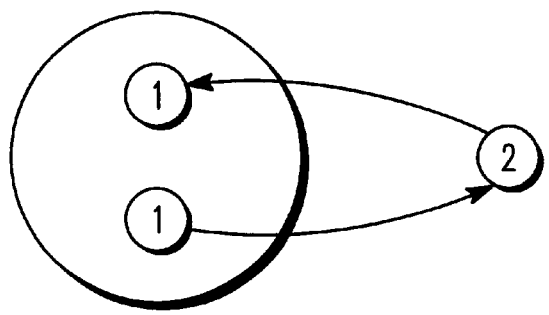
FIGS. 11 and 12 illustrate the design of a local vertical constraints graph for the net 1 of FIG. 2.
Figure 12:
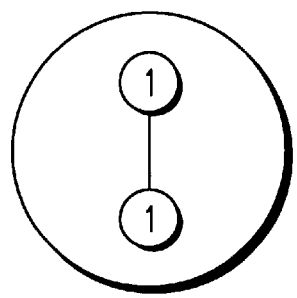

Next the net 1 is selected as the current net in step 510. FIG. 11. shows the substitution of the nodes of net 1 of the terminal vertical constraint graph into the vertical constraint graph. FIG. 12 shows the local vertical constraint graph for the net 1. The two substituent nodes are connected by an edge since there is a path between the two nodes being representative of terminals belonging to net 1 in FIG. 11. For this reason the two nodes in the local vertical constraint graph do not have to be painted by the same color so that merging can not occur. The same situation applies analogously if net 2 is subsequently selected as the current net.

Figure 13:
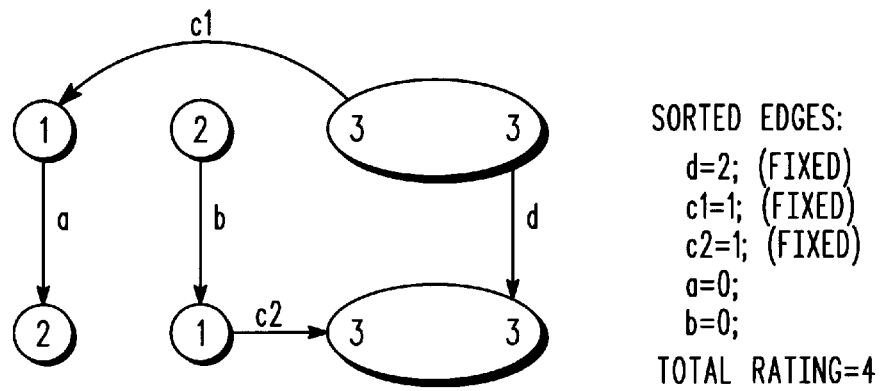
FIG. 13 shows the terminal vertical constraints graph of FIG. 12 after doglegging.
Figure 14:
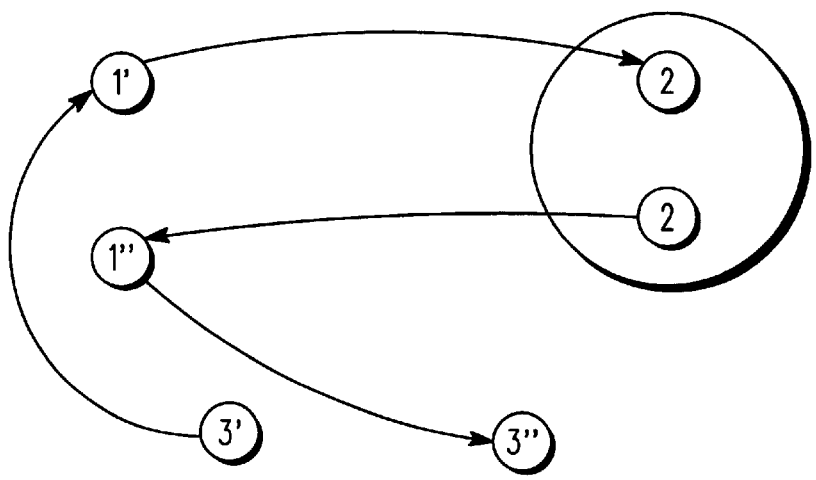
FIG. 14 shows construction of a local vertical constraint graph for the net 2 of FIG. 2 based on FIG. 13.

Since the total rating which is subsequently tested in step 308 equals 4, step 312 is carried out. The result of the doglegging is shown in FIG. 13. The edge c is replaced by the two edges c1 and c2. Next the total rating is updated again in step 504. The result is that the ratings for the edges a, b, d remain the same whereas ratings for the new edges c1 and c2 are 1. The list L2 equals {d,c1,c2}. FIG. 14 shows the corresponding vertical constraint graph after substitution of the node 2 by the corresponding nodes of the terminal vertical constraint graph of FIG. 13. The nodes 1 and 3 are split into nodes 1', 1" and 3', 3" respectively due to prior doglegging.

As there is no path between the nodes 2 they can be painted by the same color in the local vertical constraint graph. As the total rating is not below 4 step 518 is carried out. Since both of the edges a and b to which the nodes 2 are connected in the terminal vertical constraint graph do not belong to the list L2 they can be merged. The result is shown in FIG. 15.

Figure 15:
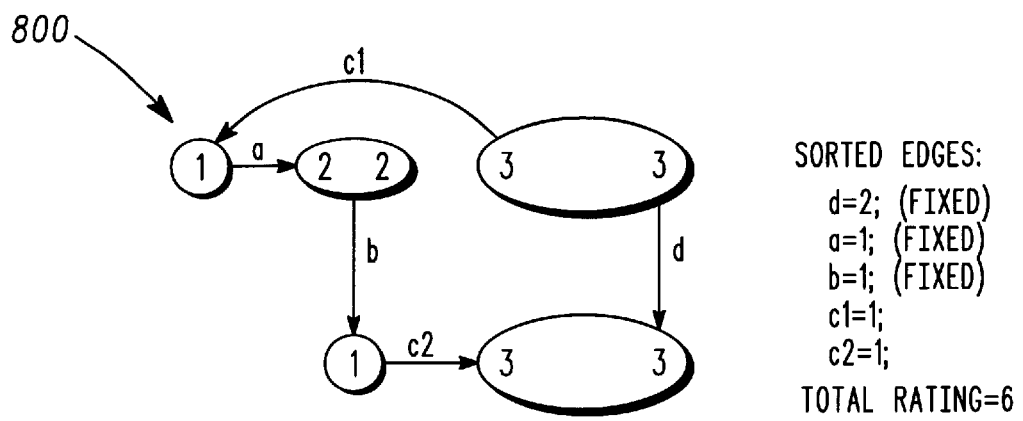
FIG. 15 shows the terminal vertical constraints graph of FIG. 13 after a second merge operation.

The updated ratings for the edges are as follows for the transformed terminal vertical constraint graph as shown in FIG. 15: d=2, a=1, b=1, c1=1 and c2=1. The corresponding list is L2={d, a, b}. The total rating is 6.

Figure 16:
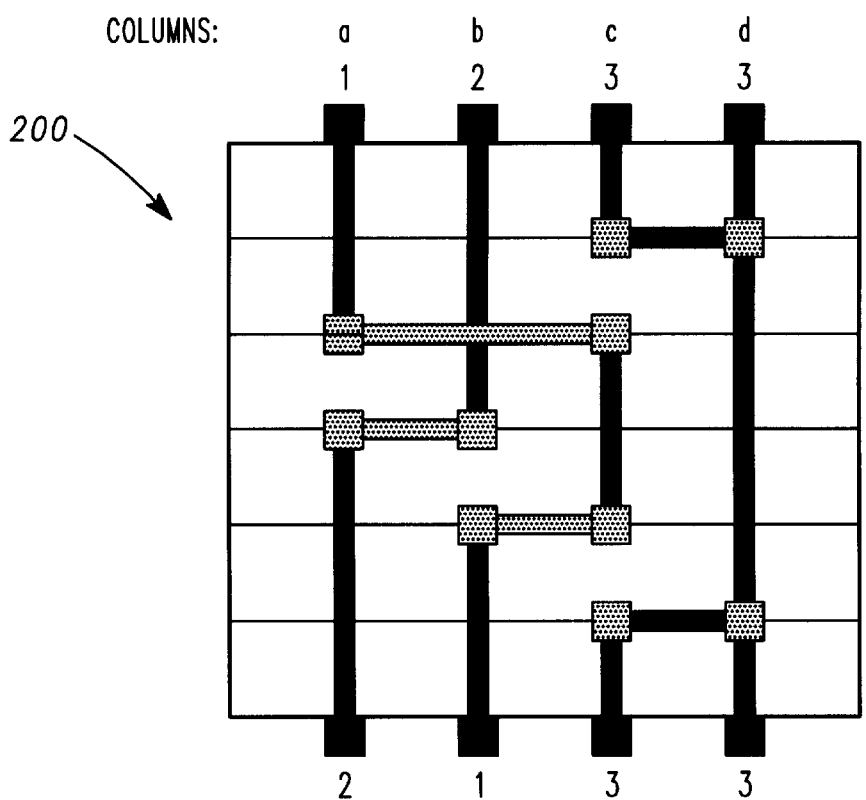
FIG. 16 shows the channel of FIG. 2 after the wiring design is complete.

FIG. 16 shows the resulting assignment of trunks to the channel (cf. step 306, FIG. 3) based on the transformed terminal vertical constraint graph of FIG. 15. The resulting wiring can be implemented into the electronic device 200 by any known suitable manufacturing process.

What is claimed is:

1. A method for designing an electronic device having a channel, said channel having a boundary and a set of terminals being situated on said boundary, said channel having tracks and columns for wiring a number of nets, each of said nets having a sub-set of said set of terminals, and said terminals of said sub-set are not vacant terminals, said channel having a wiring of said nets, said wiring being designed in accordance with the steps of:

a1) generating a terminal vertical constraint graph, said terminal vertical constraint graph comprising nodes and edges, each of said nodes being representative of at least one of said terminals, each of said edges being representative of a vertical constraint between at least a pair of said terminals which are situated in the same column and each of said edges having assigned thereto an edge rating, so that all of the terminals of said set of terminals are represented in said terminal vertical constraint graph, and said terminal vertical constraint graph having a total rating; and a2) merging of two of said nodes, said step of merging comprising the steps of:

a2.1) initializing said edge rating for each of said edges by a first predefined value;

a2.2) changing said edge rating of one of said edges by a second predefined value if said one of said edges connects to one of said nodes which has been merged;

a2.3) changing said edge rating of one of said edges by a third predefined value if said one of said edges connects to one of said nodes which is representative of a vacant terminal;

a2.4) determining said total rating by integrating said edge ratings;

a2.5) selecting two of said nodes to be merged based on said total rating;

a3) assigning of trunks to said channel according to said resulting terminal vertical constraint graph.

2. The method for designing an electronic device according to claim 1, said step of generating a vertical constraint graph comprising the steps of:

a1.1) creating one of said nodes in the terminal vertical constraint graph for each of said terminals, said nodes which are representative of vacant terminals being vacant nodes;

a1.2) creating one of said edges in the terminal vertical constraint graph between each pair of said nodes which are representative of said terminals situated in the same one of said columns, said one of said edges originating from said one of said pair of nodes being representative of said terminals being situated on an upper boundary.

3. The method for designing an electronic device according to claim 1, said step of merging further comprising the steps of:

for each one of said nets:

a2.6) if said one of said nets has exactly two of said terminals which occupy the same one of said columns, merging two of said nodes which are representative of said exactly two of said terminals;

a2.7) generating a first list of said edges, being sorted according to said edge rating;

a2.8) generating a second list of said edges, so that a sum of said edge ratings of the edges contained in the second list is above a first predefined threshold;

a2.9) generating a vertical constraint graph, selecting one node of said vertical constraint graph which is representative of said one of said nets, substituting said selected one node by another of said nodes of said terminal vertical constraint graph being representative of the same net as said selected one node;

a2.10) generating a local vertical constraint graph comprising said substituted nodes of said terminal vertical constraint graph and edges between said substituted nodes which have a path through the vertical constraint graph;

a2.11) coloring said local vertical constraint graph in minimal number of colors; grouping said nodes of said local vertical constraint graph having the same color into separate groups;

a2.12) if said total rating is not below a second predefined threshold: merging said nodes belonging to one of said groups if said nodes belonging to one of said groups do not correspond to nodes of said terminal vertical constraint graph being connected to said edges of said second list; else: merging said nodes belonging to one of said groups if said nodes belong to one of said groups do not correspond to nodes of said terminal vertical constraint graph being representative of terminals not situated in the same column.

4. An electronic apparatus having a channel, said channel having a boundary and a set of terminals being situated on said boundary, said channel having tracks and columns for wiring a number of nets, each of said nets having a sub-set of said set of terminals, and said terminals of said sub-set are not vacant terminals, said channel having a wiring of said nets, said wiring being designed in accordance with a method comprising the steps of:

a1) generating a terminal vertical constraint graph, said terminal vertical constraint graph comprising nodes and edges, each of said nodes being representative of at least one of said terminals, each of said edges being representative of a vertical constraint between at least a pair of said terminals which are situated in the same column and each of said edges having assigned thereto an edge rating, so that all of the terminals of said set of terminals are represented in said terminal vertical constraint graph, and said terminal vertical constraint graph having a total rating; and a2) merging of two of said nodes, said step of merging comprising the steps of:

a2.1) initializing said edge rating for each of said edges by a first predefined value;

a2.2) changing said edge rating of one of said edges by a second predefined value if said one of said edges connects to one of said nodes which has been merged;

a2.3) changing said edge rating of one of said edges by a third predefined value if said one of said edges connects to one of said nodes which is representative of a vacant terminal;

a2.4) determining said total rating by integrating said edge ratings;

a2.5) selecting two of said nodes to be merged based on said total rating;

a3) assigning of trunks to said channel according to said resulting terminal vertical constraint graph.

5. A computer readable medium having a computer program stored thereon for designing an electronic apparatus having a channel, said channel having a boundary and a set of terminals being situated on said boundary, said channel having tracks and columns for wiring a number of nets, each of said nets having a sub-set of said set of terminals, and said terminals of said sub-sets are not vacant terminals, said channel having a wiring of said nets, said computer program being adapted to carry out the design of said wiring in accordance with the steps of:

a1) generating a terminal vertical constraint graph, said terminal vertical constraint graph comprising nodes and edges, each of said nodes being representative of at least one of said terminals, each of said edges being representative of a vertical constraint between at least a pair of said terminals which are situated in the same column and each of said edges having assigned thereto an edge rating, so that all of the terminals of said set of terminals are represented in said terminal vertical constraint graph, and said terminal vertical constraint graph having a total rating; and a2) merging of two of said nodes, said step of merging comprising the steps of:
- a2.1) initializing said edge rating for each of said edges by a first predefined value;
- a2.2) changing said edge rating of one of said edges by a second predefined value if said one of said edges connects to one of said nodes which has been merged;
- a2.3) changing said edge rating of one of said edges by a third predefined value if said one of said edges connects to one of said nodes which is representative of a vacant terminal;
- a2.4) determining said total rating by integrating said edge ratings;
- a2.5) selecting two of said nodes to be merged based on said total rating; and a3) assigning of trunks to said channel according to said resulting terminal vertical constraint graph.

* * * * *